(12) United States Patent
Banine et al.

(10) Patent No.: US 7,167,232 B2
(45) Date of Patent: Jan. 23, 2007

(54) LITHOGRAPHIC APPARATUS AND RADIATION SOURCE COMPRISING A DEBRIS-MITIGATION SYSTEM AND METHOD FOR MITIGATING DEBRIS PARTICLES IN A LITHOGRAPHIC APPARATUS

(75) Inventors: Vadim Yevgenyevich Banine, Helmond (NL); Johannes Peterus Henricus De Kuster, Heeze (NL); Johannes Hubertus Josephina Moors, Helmond (NL); Frank Jeroen Pieter Schuurmans, Valkenswaard (NL); Lucas Henricus Johannes Stevens, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/747,613

(22) Filed: Dec. 30, 2003

(65) Prior Publication Data

US 2005/0139785 A1    Jun. 30, 2005

(51) Int. Cl.
*G03B 27/42* (2006.01)
(52) U.S. Cl. ............... 355/53; 355/67; 355/77; 378/34; 250/492.1
(58) Field of Classification Search .............. None
See application file for complete search history.

(56) References Cited

U.S. PATENT DOCUMENTS

| 4,692,934 | A  |   | 9/1987  | Forsyth |
| 4,837,794 | A  | * | 6/1989  | Riordan et al. ............. 378/119 |
| 6,377,651 | B1 |   | 4/2002  | Richardson et al. |
| 6,589,354 | B1 | * | 7/2003  | Reid ............................. 134/1 |
| 2001/0006217 | A1 |   | 7/2001 | Bisschops |
| 2003/0053594 | A1 |   | 3/2003 | Fornaciari e al. |
| 2003/0190012 | A1 |   | 10/2003 | Ahmad |

FOREIGN PATENT DOCUMENTS

| EP | 1 211 918 A1 | 6/2002 |
| EP | 1 223 468 A1 | 7/2002 |
| WO | WO 99/42904 A1 | 8/1999 |

OTHER PUBLICATIONS

International Search Report issued for PCT Patent Application No. PCT/NL2004/000921, dated Nov. 24, 2005.

* cited by examiner

*Primary Examiner*—D. Rutledge
(74) *Attorney, Agent, or Firm*—Pillsbury Winthrop Shaw Pittman LLP

(57) ABSTRACT

A lithographic apparatus is disclosed. The lithographic apparatus includes a radiation source that produces EUV radiation, an illumination system that provides a beam of the EUV radiation produced by the radiation source, and a support structure that supports a patterning structure. The patterning structure is configured to impart the beam of radiation with a pattern in its cross-section. The apparatus also includes a substrate support that supports a substrate, and a projection system that projects the patterned beam onto a target portion of the substrate. The radiation source includes a debris-mitigation system that mitigates debris particles which are formed during production of EUV radiation. The debris-mitigation system is configured to provide additional particles for interacting with the debris particles.

19 Claims, 3 Drawing Sheets

LITHOGRAPHIC APPARATUS AND RADIATION SOURCE COMPRISING A DEBRIS-MITIGATION SYSTEM AND METHOD FOR MITIGATING DEBRIS PARTICLES IN A LITHOGRAPHIC APPARATUS

BACKGROUND OF THE INVENTION

1. Field of the Invention

The present invention relates to a lithographic apparatus comprising a radiation source having a debris-mitigation system and method for mitigating debris particles in a lithographic apparatus.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

During production of EUV radiation, as well-known in the art, debris particles are formed as a by-product. The production of EUV radiation occurs by heating an object or a gas by means of a laser source of high energy density. The object or gas will produce secondary emission, EUV radiation, as well as undesired particles. These debris particles may have a detrimental effect on the performance of the lithographic apparatus as these debris particles may collect on, for example, optical elements. The debris particles present on these optical elements may hinder reflection or transmission of the radiation beam. Debris particles with relatively high kinetic energy may even cause serious damage to the apparatus by, for example, etching of the optical elements which are very expensive and very crucial parts of the apparatus. Hence, the need for mitigating debris particles.

The term "mitigating" is meant to encompass any manipulation of the debris particles which may lead to at least a reduction of the detrimental effect on the performance of the lithographic apparatus, a reduction of the damage to the lithographic apparatus, or both. The term mitigating also encompasses thermolization of particles. Thermolization is understood to be a form of manipulating the behavior of a gas or plasma such that a peak in the energy- or velocity distribution is evened out and all the particles will behave in correspondence with a stochastically derivable energy- or velocity distribution function.

A lithographic apparatus with a debris-mitigation system is described in WO99/42904. The debris-mitigation system known from this prior art comprises a filter, in particular a so-called foil trap, which may comprise a plurality of foils or plates which capture the debris particles. The plates or foils are as much as possible oriented parallel to a radiation path so that radiation will pass the filter.

Although the foil trap is useful, a lithographic apparatus with an additional or alternative debris-mitigation systems is required to provide for improved mitigation of debris particles and improved flexibility in application of a debris-mitigation system and/or allow for more freedom in the design of a lithographic apparatus.

SUMMARY OF THE INVENTION

It is, accordingly, an aspect of the present invention to provide a lithographic apparatus with an alternative debris-mitigation system as compared to a debris-mitigation system known from the prior art, or with an additional debris-mitigation system next to a debris-mitigation system known from the prior art.

Embodiments of the invention are, in particular, related to a lithographic apparatus comprising: an illumination system for providing a projection beam of radiation; a support structure for supporting a patterning device, the patterning device serving to impart the projection beam with a pattern in its cross-section; a substrate table for holding a substrate; a projection system for projecting the patterned beam onto a target portion of the substrate; and a radiation source for producing EUV radiation, wherein the radiation source comprises a debris-mitigation system for mitigating debris particles which are formed during production of EUV radiation.

According to an aspect of embodiments of the invention, there is provided a lithographic apparatus comprising: an illumination system for providing a projection beam of radiation; a support structure for supporting a patterning device, the patterning device serving to impart the projection beam with a pattern in its cross-section; a substrate table for holding a substrate; a projection system for projecting the patterned beam onto a target portion of the substrate; and a radiation source for producing EUV radiation, wherein the radiation source comprises a debris-mitigation system for mitigating debris-particles which are formed during production of EUV radiation, the debris-mitigation system is arranged to provide additional particles for interacting with the debris-particles.

According to another aspect of embodiments of the invention, a lithographic apparatus is provided. The lithographic apparatus includes a radiation source that produces EUV radiation, an illumination system that provides a beam of the EUV radiation produced by the radiation source, and a support structure that supports a patterning structure. The patterning structure is configured to impart the beam of radiation with a pattern in its cross-section. The apparatus also includes a substrate support that supports a substrate, and a projection system that projects the patterned beam onto a target portion of the substrate. The radiation source includes a debris-mitigation system that mitigates debris particles which are formed during production of EUV radiation. The debris-mitigation system is configured to provide additional particles for interacting with the debris particles.

According to a further aspect of embodiments of the invention, a lithographic apparatus is provided. The lithographic apparatus includes a radiation source that produces EUV radiation, an illumination system that provides a beam of the EUV radiation produced by the radiation source, and a support structure that supports a patterning structure. The patterning structure is configured to impart the beam of radiation with a pattern in its cross-section. The apparatus also includes a substrate support that supports a substrate, a projection system that projects the patterned beam onto a target portion of the substrate, and a particle generator that generates additional particles for interacting with debris particles.

The additional particles are particles which are different from the debris particles and different from particles present anyway in a volume where the debris particles are produced. Particles present anyway in a volume where the debris particles flow may, for example, be Argon, Krypton or He or buffer gas particles which are usually present, for example, for thermolization of the debris particles in combination with the use of the foil trap, as explained in WO99/42904. Xe gas particles may be present for use in the generation of the EUV radiation according to a method for producing EUV radiation well-known in the art. Also, other materials may be used for generation of EUV radiation, and particles from these materials may form debris particles. It has been found that the additional particles can interact with debris particles, for example, in at least one of the manners described below, and that by actually adding particles to the debris particles, the debris particles can be mitigated.

In an embodiment of a lithographic apparatus according to the invention, the debris-mitigation system is arranged to provide a flow of the additional particles. This allows for dragging the debris particles along with the flow of additional particles by, for example, transferring momentum from an additional particle to a debris particle. By controlling the direction of the flow of additional particles, it is at least to some extent possible to control the direction of the debris particles and, hence, to mitigate the debris particles by, for example, directing the additional and the debris particles towards a filter such as a foil trap, or towards a pump. The interaction between the additional particles and the debris particles as applicable in this embodiment may largely be based on elastic and/or non-elastic collisions between debris particles, especially neutral debris particles, and neutral particles of the additional flow. The effective cross sectional area that a neutral particle "covers" in the flow of additional particles for interaction with neutral debris particles is approximately $1*10^{-19}$–$1*10^{-20}$ m$^2$.

In an embodiment of a lithographic apparatus according to the invention, the debris-mitigation system is arranged to provide the flow into a direction which is substantially different from a downstream direction of a radiation beam. As soon as the radiation is produced, a radiation beam is defined by that part of the radiation produced that is collected for further developing a radiation beam. The flow may drag debris particles into a direction which is substantially different from the downstream direction of a radiation beam and, as such, prevents optical elements from being approached by these particles.

In an embodiment of a lithographic apparatus according to the invention, the debris-mitigation system is arranged to provide the flow of additional particles such that, in use, the additional particles substantially cross a radiation beam within the lithographic apparatus. In a lithographic apparatus according to this embodiment, at least some of the debris particles are knocked out sideways of the "downstream" direction of a radiation path within the lithographic apparatus. As such, debris particles can be mitigated. Sideways of the radiation path, a debris-capturing system may be provided for capturing the debris particles which have been knocked out. Such a system may comprise, for example, a foil trap or a pump.

In an embodiment according to the invention, the lithographic apparatus comprises a collector for collecting EUV radiation originating from the radiation source, the debris-mitigation system being further arranged to provide the flow of additional particles such that the additional particles flow substantially away from the collector. Hence, in this embodiment, the debris particles are mitigated such that the debris particles are at least hindered in approaching the collector, leading to a reduction of debris particles reaching the collector.

In an embodiment of a lithographic apparatus according to the invention, the debris-mitigation system is further arranged to provide the flow of additional particles as a supersonic flow. In this embodiment, collisions between additional particles and debris particles are even more effective with regard to changing a direction of the debris particles from the downstream direction of the radiation path, due to the high velocity of the additional particles.

In an embodiment of a lithographic apparatus according to the invention, the additional particles comprise ionized particles. This has several advantages. First of all, an ion beam can be focused due to the charged nature of the additional particles in such a flow. This means that the flow can be directed more effectively towards a volume where debris particles need to be mitigated. The width of the flow can also be kept large if so desired using electrodes attracting the ions. Furthermore, it is possible to also effectively pump the ionized particles using, for example, an ion getter pump. It is also possible that ionized particles further ionize neutral particles, thereby further enhancing the possibility of directing these particles towards electrodes or an ion getter pump. The effective cross sectional area which an ionized particle appears to "cover" in the flow of additional particles for interaction with neutral debris particles is approximately $1*10^{-18}$–$1*10^{-19}$ m$^2$. The flow of ionized particles efficiently mitigates debris-particles, especially when these debris-particles comprise ionized particles. Again, the effective cross sectional area which an ionized particle appears to "cover" in the flow of additional particles for interaction with ions is approximately $1*10^{-15}$ m$^2$.

In an embodiment of a lithographic apparatus according to the invention, the debris mitigation system further comprises electrodes which are arranged to cause a discharge of particles when a suitable voltage is applied, so that additional particles are generated. A large amplitude electric field can be generated with these electrodes, for example, in a dense gas curtain such as a supersonic jet. This may cause direct current discharge. The electronic field may also be pulsed. This leads to the production of ions which will improve the mitigation of the debris particles as explained herein.

In an embodiment of a lithographic apparatus according to the invention, the debris-mitigation system comprises a plasma generator for generating the additional particles. This allows for generating at least some of the additional particles from particles present already, such as, for example, the debris particles themselves, or from other added particles.

In an embodiment of a lithographic apparatus according to the invention, the plasma generator may comprise Radio Frequency induction coils or the plasma generator may be arranged to apply a direct current discharge. This embodiment is preferably arranged to provide a background gas. This background gas is preferably arranged to move in a flow slowly away from the radiation collector. In such an embodiment, relatively slow ion and relatively slow neutral types of debris can be removed from the debris particles by producing in the flow of background gas slowly moving away from the radiation collector, a plasma with a temperature expressed in energy in the order of some electronvolts, i.e., preferably about 2.5–3 eV in Argon or about 5 eV in Helium. This plasma will, for example, ionize neutral debris particles which move from the EUV source towards the collector. However, when ionized, these debris particles will easily be caught in the flow of background gas moving in a direction away from the radiation collector. The ionized debris particles may then flow with the background gas towards a surface for capturing debris particles or a pump. If the flow of background gas is substantially upstream of the radiation path in the lithographic apparatus, the time of residence of the debris particles during movement towards the collector is enhanced, thereby increasing the ionization probability and the possibility to be mitigated as an ionized particle or by an ionized particle. This provides an effective way of protecting optical elements from debris particles.

According to a further aspect of the invention, there is provided a method for mitigating, in a radiation source for producing EUV radiation, debris particles formed during use of at least a part of the lithographic apparatus, characterized in that, the method comprises providing additional particles for interacting with the debris particles.

According to another aspect of embodiments of the invention, there is provided a method for mitigating debris particles that are formed during production of extreme ultra violet radiation. The method includes providing additional particles for interacting with the debris particles.

According to a further aspect of the invention, there is provided a radiation source for producing EUV radiation comprising a debris-mitigation system as present in any of the embodiments of a lithographic apparatus referred to above.

According to another aspect of embodiments of the invention, there is provided an extreme ultraviolet radiation source. The EUV radiation source includes a debris-mitigation system to mitigate debris particles that are formed during production of EUV radiation. The debris-mitigation system is arranged to provide additional particles that interact with the debris particles.

According to yet another aspect of embodiments of the invention, an EUV radiation source for generating EUV radiation for use in lithography is provided. The EUV radiation source generates debris particles as a byproduct of EUV generation, and includes a particle generator that generates secondary particles that interact with the debris particles and reduce the adverse affect that the debris particles may have on lithography.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass extreme ultra-violet (EUV) radiation (e.g. having a wavelength in the range of 5–20 nm).

The term "patterning device" or "patterning structure" as used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of the patterning device, the support structure may be a frame or table, for example, which may be fixed or movable, as required, and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors, such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
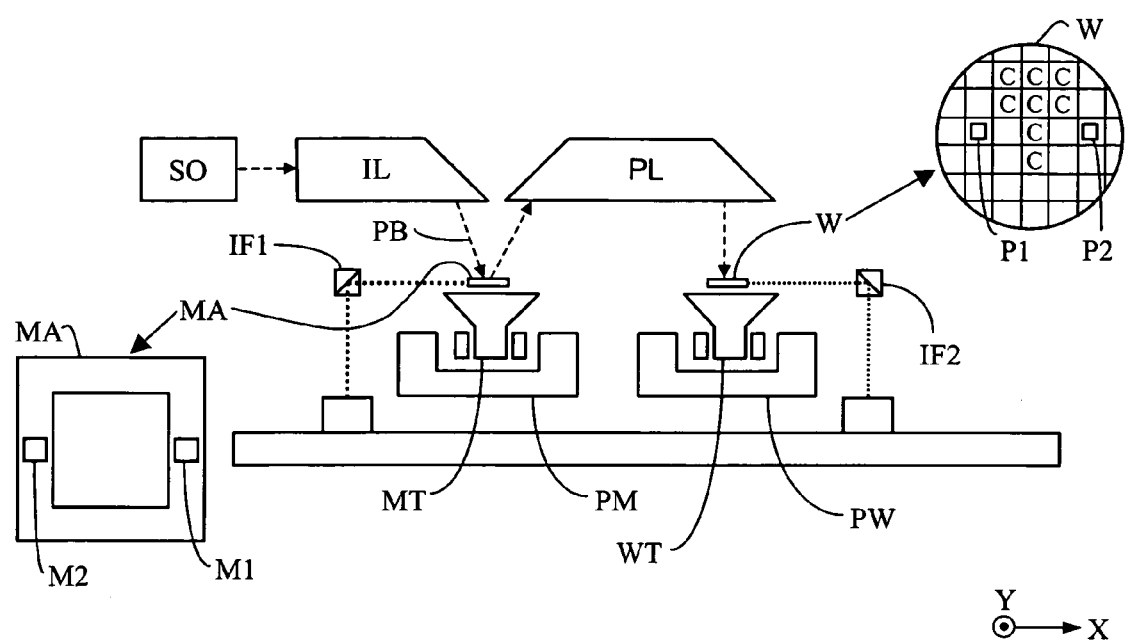
FIG. 1 depicts a lithographic apparatus according to an embodiment of the invention.

FIG. 1 schematically depicts a lithographic apparatus according to a particular embodiment of the invention. The apparatus comprises: an illumination system (illuminator) IL for providing a projection beam PB of radiation (e.g. EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W. The term "substrate table" as used herein can also be considered or termed as a substrate support. It should be understood that the term substrate support or substrate table broadly refers to a structure that supports, holds, or carries a substrate.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source may not necessarily be considered to form part of the lithographic apparatus, and the radiation beam is generally passed from the source SO to the illuminator IL with the aid of a radiation collector comprising for example suitable collecting mirrors and/or a spectral purity filter. In other cases, the source may be integral part of the apparatus. The source SO and the illuminator IL, may be referred to as a radiation system.

The illuminator IL may comprise an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
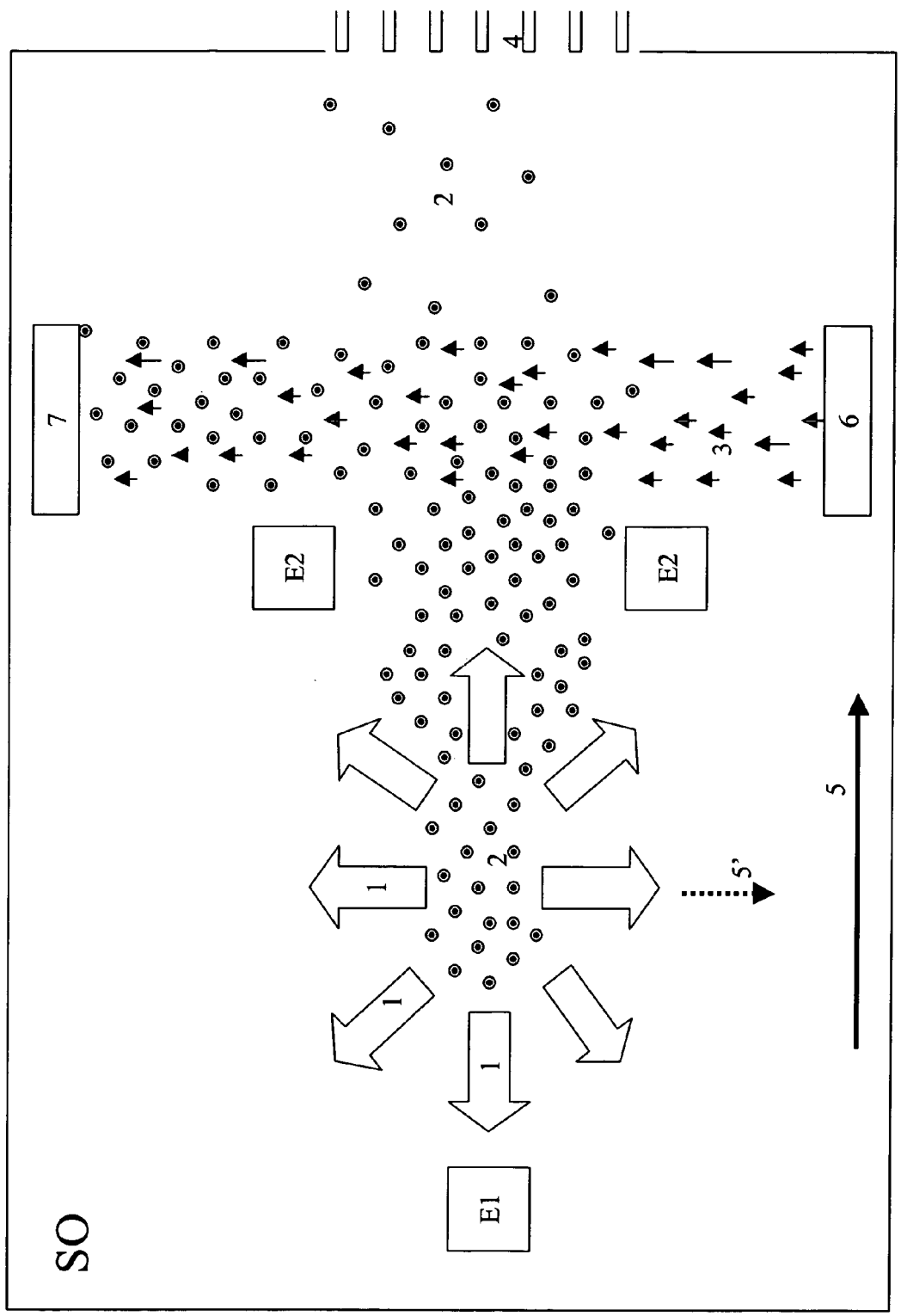
FIG. 2 depicts schematically a radiation source for producing EUV radiation according to an embodiment of the invention.

FIG. 2 depicts schematically a radiation source SO for producing EUV radiation according to an embodiment of the invention. The source may comprise electrodes E1, E2 and EUV radiation may be produced in a manner well-known in the art, for example, by hitting a gas (not shown) with a high energy laser (not shown). Arrows 1 schematically represent the EUV radiation formed as secondary emission by the gas particles hit by the laser. Debris particles 2 are being produced as a by-product. A radiation source for producing EUV radiation is generally arranged to guide the debris particles into a specific direction. In this embodiment, this is arranged, for example, by the presence of the electrodes E1, E2, which are oppositely chargeable. E2 and/or E1 may be a ring-shaped electrode. In the embodiment shown in FIG. 2, part of the radiation produced by radiation source SO is passed to a collector 4 for collecting EUV radiation. As soon as the radiation is produced, a radiation beam is defined by the part of the radiation which is collected by collector 4 for further developing a radiation beam. The direction into which the debris particles flow as a result of the electrodes when oppositely charged and, optionally, magneto-hydrodynamic forces which are also generated within the source SO, coincides in this embodiment with the direction of EUV radiation entering the collector 4. This direction is indicated by arrow 5. The radiation source SO for producing EUV radiation has a debris-mitigation system for mitigating debris particles 2 which are—as an undesired by-product—formed during production of EUV radiation.

The debris-mitigation system is arranged to provide additional particles 3 for interacting with the debris particles 2. The additional particles 3 are indicated by small arrows 3. In the embodiment shown in FIG. 2 the debris mitigating system is arranged to provide a flow of the additional particles 3. In this case the debris-mitigation system may comprise, for example, an outlet, schematically represented by box 6, and a pump, schematically represented by box 7. The debris-mitigation system in the embodiment shown, is arranged to provide a flow into a direction which is substantially different from a downstream direction of a radiation beam. The downstream direction of the radiation beam is indicated by arrow 5. The debris-mitigating system is arranged to provide a flow of additional particles such that, in use the additional particles substantially cross a radiation beam. The additional particles 3 may transfer momentum to the debris particles 2 such that the direction of he debris particles 2 will be influenced. The direction of the debris particles 2 originally moving towards collector 4 will, due to the transfer of momentum, be changed into another direction. It is likely that in an embodiment as shown in FIG. 2, the direction of the debris particles changes into a direction towards the pump 7 of the debris-mitigation system.

To protect the collector 4 for collecting EUV radiation from being hit by debris particles originating from the radiation source SO, the debris-mitigation system is arranged to provide a flow of additional particles such that the additional particles flow substantially away from the collector 4. It is thus not necessarily the case that the flow of additional particles crosses the radiation beam. It is also possible that the flow of additional particles is directed opposite the direction of the radiation beam.

In a particular embodiment of a radiation source according to the invention, the debris-mitigation system is further arranged such that the flow of additional particles is a supersonic flow.

The additional particles may comprise gas particles, such as, for example, argon, helium etc. However, the additional particles may also comprise ionized particles. In that case, box 6 represents an ionizer from which ionized particles are accelerated away to collide with the debris particles. Where the debris particles are neutral particles, the effective cross sectional area a neutral particle "covers" in the flow of additional particles for interacting with neutral debris particles is approximately $1*10^{-19}$–$1*10^{-20}$ m$^2$. On the other hand, the effective cross sectional area which an ionized particle appears to "cover" in the flow of additional particles for interaction with neutral debris particles is approximately $1*10^{-18}$–$1*10^{-19}$ m$^2$. When the debris particles comprise ionize particles, which may very well be the case, the effective cross sectional area which an ionized additional particle appears to cover in the flow of additional particles is approximately $1*10^{-15}$ m$^2$. In other words, the presence of ionized particles as additional particles improves the mitigation of debris particles.

Pump 7 may be an ion getter pump instead of a pump any other debris capturing system may employ. The debris-mitigation system may also be employed such that debris particles following arrow 5' will be mitigated according to methods used in the embodiments described above, when the collector 4 is situated such that radiation following arrow 5' will enter the collector 4.

Figure 3:
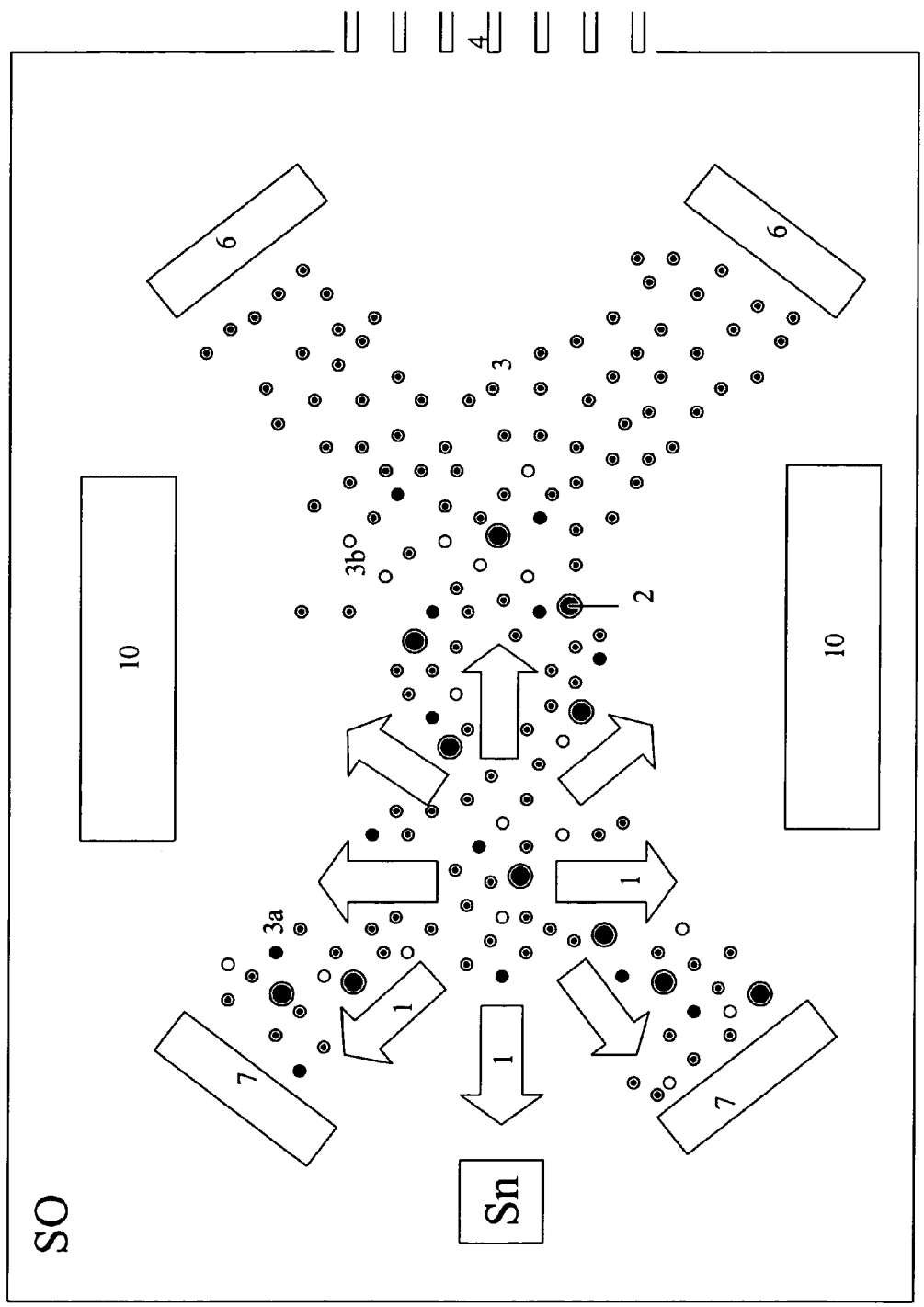
FIG. 3 depicts schematically another embodiment of an EUV radiation source according to the invention.

FIG. 3 depicts schematically another embodiment of a radiation source SO according to the invention. The source may produce EUV radiation employing Sn-material, as is well known in the art of producing EUV radiation. In this embodiment, the debris-mitigation system may comprise a plasma generator 10 for generating the additional particles, i.e. additional ionized particles. The additional particles 3 can, when such an embodiment is in use, be generated from the debris particles 2. However, it is also possible that the additional particles are generated from, for example, a background gas which is, in the embodiment shown in FIG. 3, released from outlets 6 and pumped away by pumps 7. In this embodiment, the additional particles may comprise particles of the background gas 3 as well as particles generated from the debris particles 2, the background gas particles 3, or both. The additional particles generated from either the debris particles 2 and/or the background gas particles 3 are presented as black and white dots 3a, 3b. The plasma generator may comprise radio frequency induction coils.

In either of the embodiments shown in FIG. 2 and FIG. 3, the debris-mitigation system may comprise electrodes which are arranged to cause a discharge of particles, so that additional particles are generated. In either figure, box 6 may be, for example, a positively charged electrode. In FIG. 2, electrodes E1 and E2 may be additionally or alternatively arranged to cause a discharge of particles. A discharge results in the production of additional particles, in particular ions which, as explained earlier, aid the mitigation of debris particles. The electrodes may be arranged to cause a large amplitude electric field to cause the discharge and the production of ions. However, the electric field may also have a pulsed nature. This may lead to an inhomogeneity in the ionization rate in a volume. This inhomogeneity in itself may lead to an electric field, further causing ionizations. This ionization may at least partly compensate for recombination of charged particles which may, as recombined, be nanoparticles being part of the debris particles. Such nanoparticles may in itself act as volume sinks for the recombined charged particles, further mitigating debris particles. Again, one or more pumps may be used to absorb the debris particles.

It should be noted that it is possible to combine an embodiment according to FIG. 2 and an embodiment according to FIG. 3. These variations are all understood to be part of the same invention. Furthermore, the debris mitigation system may be employed much closer to optical elements within the lithographic apparatus.

While specific embodiments of the invention have been described above, it will be appreciated that the invention may be practiced otherwise than as described. The description is not intended to limit the invention.

What is claimed is:

1. A lithographic apparatus comprising:
   a radiation source that produces EUV radiation;
   an illumination system that provides a beam of said EUV radiation produced by said radiation source;
   a support structure that supports a patterning structure, the patterning structure configured to impart the beam of radiation with a pattern in its cross-section;

a substrate support that supports a substrate; and a projection system that projects the patterned beam onto a target portion of the substrate, wherein said radiation source comprises a debris-mitigation system that mitigates debris particles which are formed during production of EUV radiation, the debris-mitigation system configured to provide additional particles for interacting with the debris particles, and wherein the debris-mitigation system comprises a plurality of electrodes that cause a discharge of particles when a suitable voltage is applied so that the additional particles are generated.

2. A lithographic apparatus according to claim 1, wherein the debris-mitigation system is arranged to provide a flow of the additional particles.

3. A lithographic apparatus according to claim 2, wherein the debris-mitigation system is arranged to provide the flow into a direction which is substantially different from a downstream direction of a radiation beam.

4. A lithographic apparatus according to claim 2, wherein the debris-mitigation system is arranged to provide the flow of additional particles that substantially cross a radiation beam.

5. A lithographic apparatus according to claim 2, further comprising a collector for collecting EUV radiation that originates from the radiation source, wherein the debris-mitigation system is further arranged to provide the flow of additional particles such that the additional particles flow substantially away from the collector.

6. A lithographic apparatus according to claim 2, wherein the debris-mitigation system is further arranged to provide a supersonic flow of additional particles.

7. A lithographic apparatus according to claim 1, wherein the additional particles comprise ionized particles.

8. A lithographic apparatus according to claim 1, wherein the debris-mitigation system further comprises a plasma generator that generates further additional particles.

9. A lithographic apparatus according to claim 8, wherein the plasma generator comprises Radio Frequency induction coils.

10. A lithographic apparatus comprising:

a radiation source that produces EUV radiation;

an illumination system that provides a beam of said EUV radiation produced by said radiation source;

a support structure that supports a patterning structure, the patterning structure configured to impart the beam of radiation with a pattern in its cross-section;

a substrate support that supports a substrate;

a projection system that projects the patterned beam onto a target portion of the substrate; and a particle generator that generates additional particles for interacting with debris particles, wherein said particle generator comprises an outlet and a pump.

11. A lithographic apparatus according to claim 10, wherein said particle generator further comprises a plurality of electrodes.

12. A lithographic apparatus according to claim 10, wherein said pump comprises an ion getter pump.

13. A lithographic apparatus according to claim 10, wherein said outlet and said pump are arranged to provide a flow of the additional particles in a direction substantially different from a downstream direction of the beam of radiation.

14. A lithographic apparatus according to claim 10, wherein said particle generator forms part of said radiation source.

15. A lithographic apparatus according to claim 10, wherein the particle generator is arranged to provide a supersonic flow of the additional particles.

16. A lithographic apparatus comprising:

a radiation source that produces EUV radiation;

an illumination system that provides a beam of said EUV radiation produced by said radiation source;

a support structure that supports a patterning structure, the patterning structure configured to impart the beam of radiation with a pattern in its cross-section;

a substrate support that supports a substrate; and a projection system that projects the patterned beam onto a target portion of the substrate, wherein said radiation source comprises a debris-mitigation system that mitigates debris particles which are formed during production of EUV radiation, the debris-mitigation system configured to provide additional particles for interacting with the debris particles, and wherein the debris-mitigation system comprises a plasma generator configured to provide ionized particles.

17. A lithographic apparatus according to claim 16, wherein the plasma generator comprises Radio Frequency induction coils.

18. A lithographic apparatus comprising:

a radiation source that produces EUV radiation;

an illumination system that provides a beam of said EUV radiation produced by said radiation source;

a support structure that supports a patterning structure, the patterning structure configured to impart the beam of radiation with a pattern in its cross-section;

a substrate support that supports a substrate; and a projection system that projects the patterned beam onto a target portion of the substrate, wherein said radiation source comprises a debris-mitigation system that mitigates debris particles which are formed during production of EUV radiation, the debris-mitigation system configured to provide a supersonic flow of additional particles for interacting with the debris particles.

19. A lithographic apparatus comprising:

a radiation source that produces EUV radiation;

an illumination system that provides a beam of said EUV radiation produced by said radiation source;

a support structure that supports a patterning structure, the patterning structure configured to impart the beam of radiation with a pattern in its cross-section;

a substrate support that supports a substrate;

a projection system that projects the patterned beam onto a target portion of the substrate; and a particle generator that generates additional particles for interacting with debris particles, wherein the particle generator comprises a plurality of electrodes.

* * * * *